United States Patent [19]

Faierstain

[11] 4,322,718
[45] Mar. 30, 1982

[54] SOUND-ACTIVATED ROTARY DEVICE

[76] Inventor: Paul Faierstain, 3807 Sunset La., Northbrook, Ill. 60062

[21] Appl. No.: 151,315

[22] Filed: May 19, 1980

[51] Int. Cl.³ .............................................. G08B 3/10
[52] U.S. Cl. ................................ 367/197; 340/825.77
[58] Field of Search .................. 340/148, 169, 171 R, 340/566; 307/362, 117

[56] References Cited

U.S. PATENT DOCUMENTS

| | | | |
|---|---|---|---|
| 3,757,303 | 9/1973 | Blass | 340/148 |
| 3,801,959 | 4/1974 | O'Brien | 340/148 |
| 3,855,574 | 12/1974 | Welty | 340/148 |
| 4,084,138 | 4/1978 | Wycoff | 340/171 R |
| 4,103,294 | 7/1978 | Stettner | 340/148 |
| 4,176,286 | 11/1979 | Shuffield | 307/362 |
| 4,211,998 | 7/1980 | Junginger | 340/148 |

*Primary Examiner*—Harold I. Pitts
*Attorney, Agent, or Firm*—Jerome Goldberg

[57] ABSTRACT

There is disclosed herein a sound-activated device which is adapted to operate rotary loads, such as a turntable, a circular display, a suspended mobile and/or a fan. The device includes a power supply, an electric motor connected to the power supply and to the rotary load. A sound-activated circuit is coupled to the power supply and electric motor for causing the rotary load to operate when sound having a value in excess of a predetermined level is detected.

The circuit includes a sound transducer coupled to a signal processing and conditioning unit. A threshold audio sensitivity control is associated with the processing unit for establishing the predetermined level. A timer triggering circuit is coupled to the processing unit and is activated when the threshold is exceeded and then generates a timer trigger signal. The timer trigger circuit receives the trigger signal and is activated in response thereto for a preset time. An electronic switch is coupled to the timer circuit for operating the motor when the switch receives the timer circuit signal.

10 Claims, 4 Drawing Figures

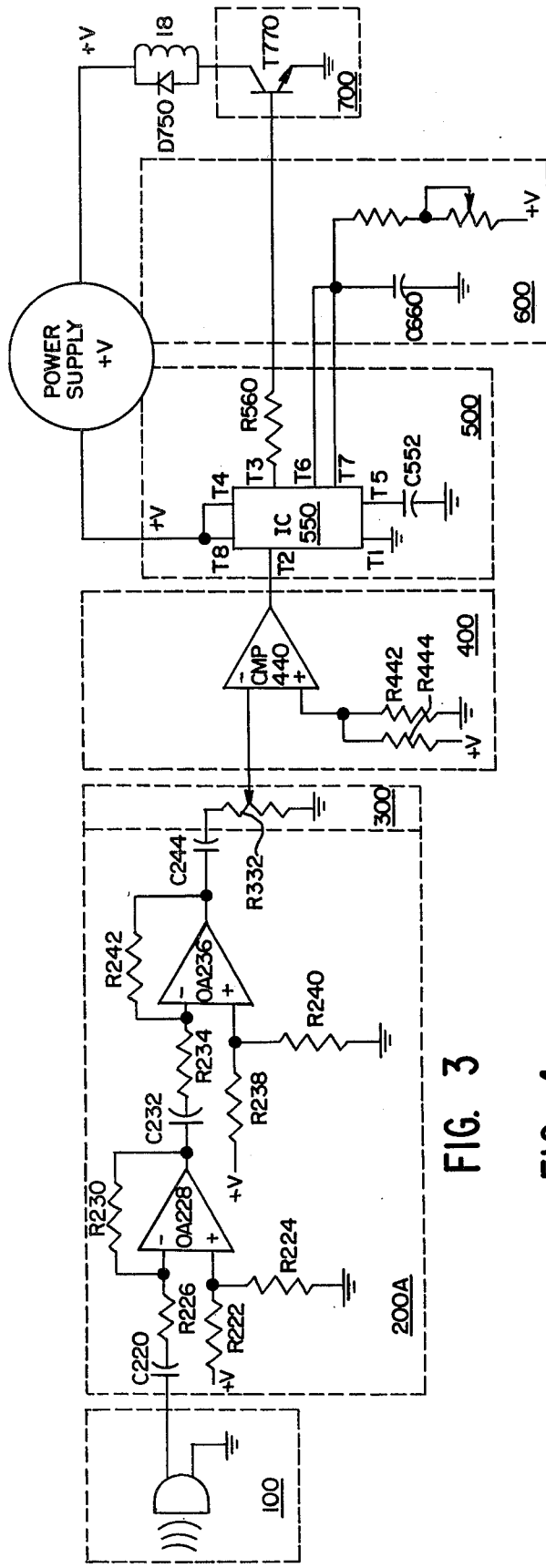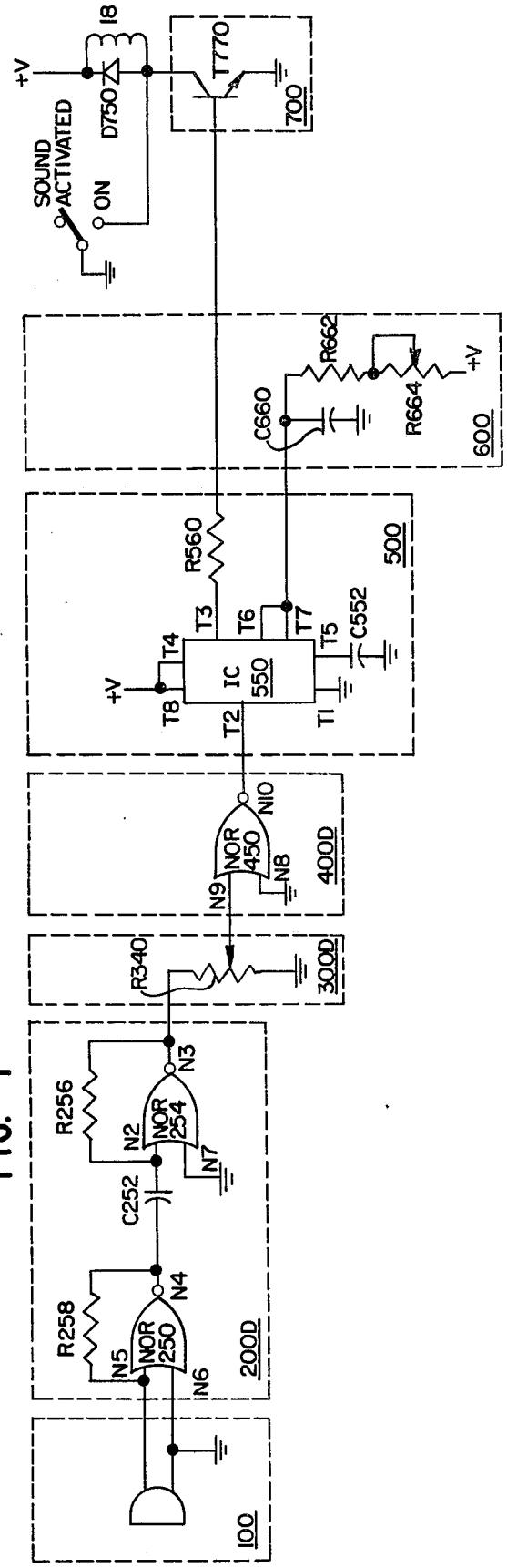
FIG. 3
FIG. 4

SOUND-ACTIVATED ROTARY DEVICE

BACKGROUND OF THE INVENTION

This invention relates to sound-activated devices, and more particularly, to devices which employ a motor to impart a rotary movement to some object.

Sound-activated devices of various types are known, and such devices can: (1) issue an alarm in the event of an intrusion; (2) illuminate a room upon detection of sound which exceeds a predetermined level; (3) control the direction of movement of a toy automobile; or (4) control the operation of other devices.

Such devices and sound-activated circuits are disclosed in the following U.S. Pat. Nos.: 3,119,201; 3,270,216; 3,748,496; 3,761,912; 3,898,383; 4,024,413; 4,027,425; 4,086,724; and 4,099,168.

However, it has been determined that it is desirable to have a sound-activated device which includes a motor for imparting rotary movement to an object for a predetermined length of time. Such devices can include a turntable having figures thereon; a circular display which moves past a window; a hanging unit from which a mobile or like devices can be suspended; or a fan which blows air across an air freshener.

Devices such as a hanging mobile are desirable for entertaining an infant. For example in the event the infant cries, such cries would activate the mobile for a predetermined length of time so as to entertain the child. If at the end of that length of time the child stops crying, then the device would not be reactivated. However, if the infant still cried, then the device could be reactivated to further entertain the child. Other such uses are contemplated.

It is therefore an object of this invention to provide a sound-activated system which employs a motor for imparting a rotary movement to some object for a predetermined length of time.

It is another object of this invention to provide specific sound-activating circuitry for use with such systems.

These and other objects will become apparent from the following description and appended claims.

SUMMARY OF THE INVENTION

There is disclosed herein a sound-activated device which includes a motor for imparting a rotary movement to a rotatable display, fan, or other similar object. The object can be a turntable, a circular display, or a hanging unit with such as a mobile or fan to blow air across the surface of an air freshener. The device includes circuit means which is sound-activated which can be manually activated. In order to operate in the sound-activated mode, the device is provided with circuit means which includes a sound transducer; a signal processing and conditioning unit; a threshold or trigger circuit with associated sensitivity control; a timer circuit with associated time set controls; and an electronic switch which is connected to the motor.

This system can be DC-battery operated or AC rectified to DC current.

BRIEF DESCRIPTION OF THE DRAWINGS

FIG. 3 is a schematic diagram of a first embodiment of the circuit; and

FIG. 4 is a schematic diagram representing the second embodiment for the circuit.

DESCRIPTION OF THE PREFERRED EMBODIMENT

General

Figure 1:
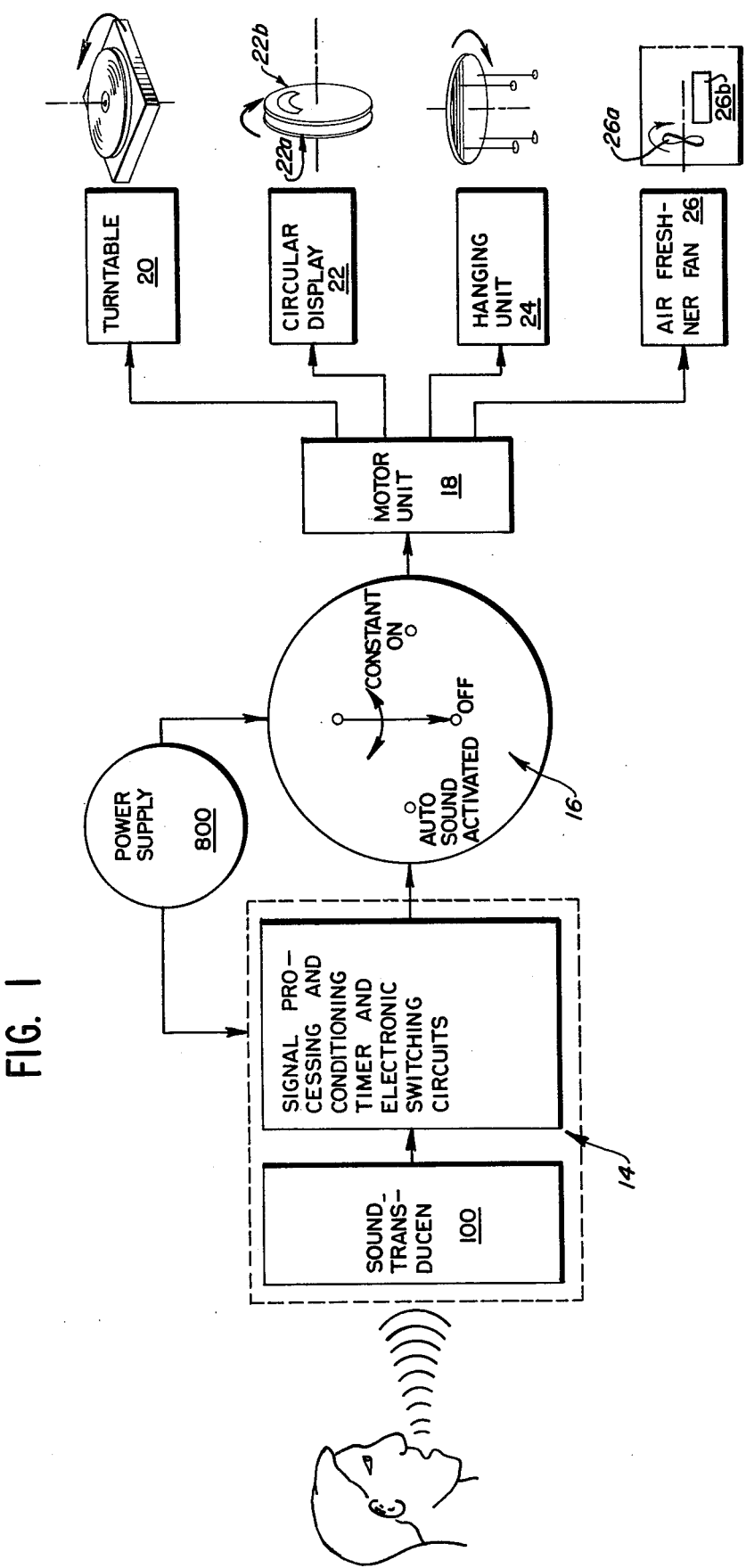
FIG. 1 is a diagrammatic view showing the sound source, the sound transducer, the signal processing and conditioning unit, and the various rotary loads which can be operated by the system.

Referring now to FIG. 1, a sound source 10 is shown from which sound waves 12 emanate and which are received by a sound transducer 100 that is part of the sound-activated circuit 14, generally. The circuit can be operated in a manual mode or a sound-activated mode by use of a switch, such as 16. In the sound-activated mode, the circuit 14 activates the motor 18, which is, in turn, connected to one of the rotary loads, such as 20, 22, 24 or 26.

In one embodiment the load 20 is a turntable upon which a fanciful display is mounted for rotation about a substantially vertical axis. The coupling between motor 18 and turntable 20 may be of a conventional design. Various figures or fanciful shapes can be placed on the turntable.

In another embodiment the load is a circular display 22, which is also coupled to the motor 18 for activation. In this display a disc 22a rotates about a horizontal axis and behind an apertured mask 22b so as to provide selective display of indicia on the disc.

In yet another embodiment, a hanging unit 24 is provided from which a mobile or other object is suspended for rotation about a vertical axis.

In a different arrangement, an air freshener apparatus 26 is provided. That apparatus includes a fan 26a which is coupled to the motor and upon such activation blows air over the surface of the air freshener block 26b to freshen a room, area, or the like. One such application would be in an automobile where the air freshener would be activated upon closing of a car door. When the door was closed, the circuit 14 would cause the fan to operate for a predetermined time in order to freshen the air in the automobile.

The Block Diagram

Figure 2:
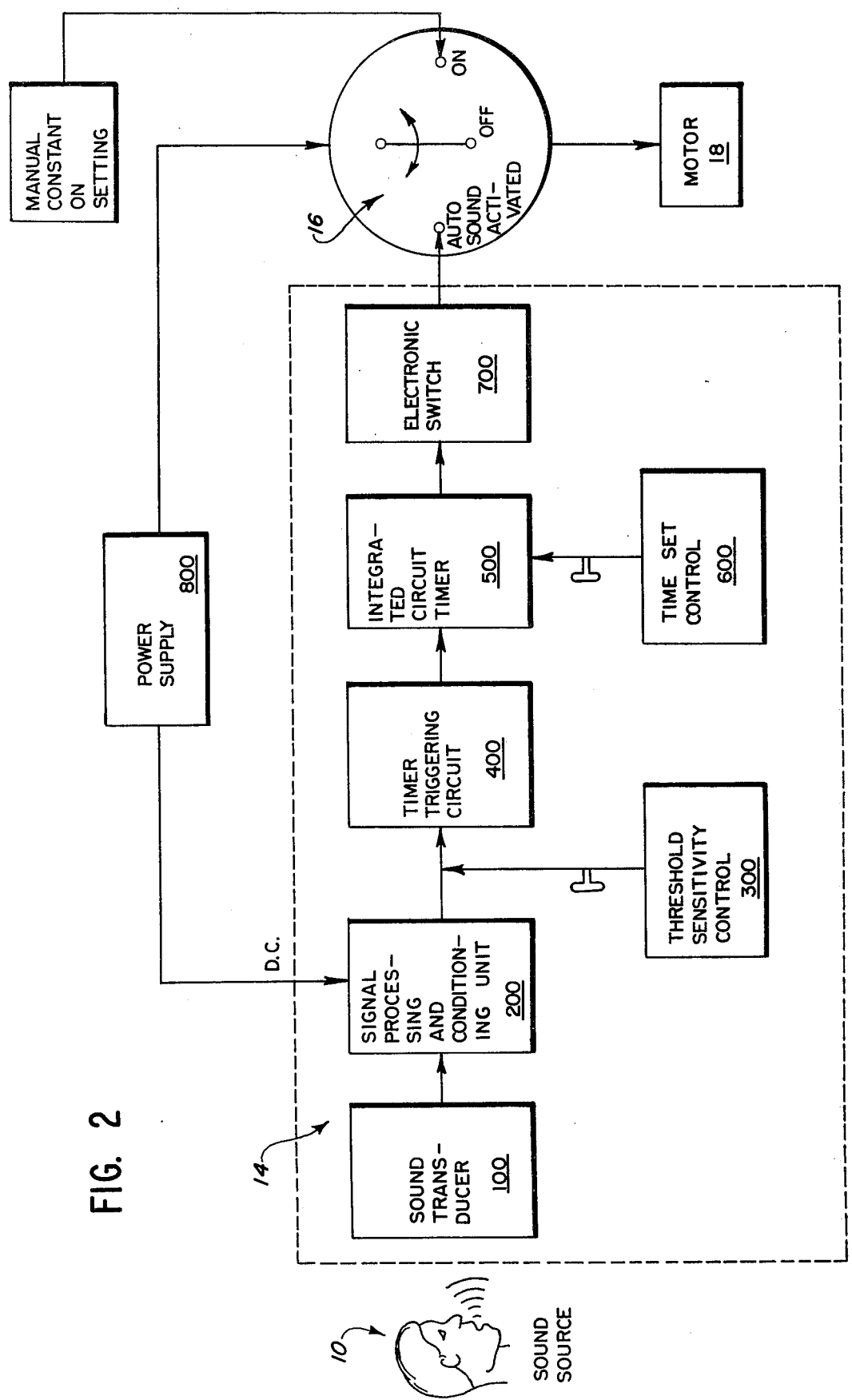
FIG. 2 is a block diagram representing the various circuit elements.

Referring now to the block diagram of FIG. 2, the circuit 14, generally, is shown. Sound emanating from the source 10 is received by the sound transducer 100 which is coupled to a signal processing and conditioning unit 200. Associated with the signal processing and conditioning unit 200 is a threshold sensitivity control 300. The signal processing and conditioning unit 200 is coupled to a timer triggering circuit 400 which, in turn, connects to an integrated circuit timer 500. A time set control 600 is associated with the timer 500 for controlling the duration of operation. The timer 500 is also connected to an electronic switch 700 which, in turn, is connected to the motor unit 18. The manual switch 16 also connects to the motor unit 18 as shown for manual override. Power supply 800 is provided for the main load line and the automatic switching sound-activated circuit 14. Power to circuit must be DC, or rectified AC to DC.

In operation, an audio threshold sensitivity is selected and entered in the audio threshold sensitivity control 300 and a time duration is also selected and entered in the time set control 600. In this system, the time delay signal can be selected between desirable intervals of operation.

The audio transducer 100 receives an audio signal and converts it to an electronic signal which is communicated to the signal processing and conditioning unit 200. If the signal from the unit 200 exceeds the previously set threshold sensitivity, that signal is communicated to the timer triggering circuit 400. The timer triggering circuit upon receiving that signal activates the integrated circuit timer 500. The timer, in turn, activates the electronic switch 700, thereby permitting the motor 18 to operate for the preselected time period set in the time set unit 600.

The Schematic Diagrams

Referring now to FIGS. 3 and 4, the specific circuit components comprising the circuit elements as set forth in FIG. 2 is discussed hereinafter.

Referring first to FIG. 3, the sound transducer 100 (which may be a common microphone) produces an audio frequency signal that is transmitted to the signal processing and conditioning unit 200. In the embodiment disclosed in FIG. 3 is the signal amplification circuit 200A. Generally speaking, the amplified electronic audio signal is passed on to a threshold sensitivity control device 300. As so constituted, the amplified audio signal is transmitted through the timer triggering circuit 400. The output thereby derived from the timer triggering circuit 400 is communicated to integrated circuit timer 500. The input from the timer triggering circuit 400 triggers the integrated circuit timer 500 to produce a pulse of predetermined duration, set by the time set control 600, which is communicated to the electronic switching circuit 700. The electronic switching circuit 700 is turned on for a length and duration of time substantially equivalent to that predetermined by the time set control setting 600, such that the electrical motor 18 is operated for a period of time of duration substantially equal to the duration of the signal emanating from the electronic switching circuit 700. Power in this embodiment may be from a DC or rectified AC to DC source (+v).

With regard to the foregoing description, signal amplification circuit 200A is coupled to the microphone by a coupling capacitor C220 of a capacitance as indicated in Table 1 herein. The coupling capacitor C220 is connected to resistor R226 in series, said resistor R226, in turn, being connected to the (negative) inverting terminal of an operational amplifier OA228, the specifications of which are also indicated on Table 1. The bias for the operational amplifier OA228 is provided at the (positive) non-inverting terminal of the operational amplifier through resistor R222 and grounded at R224. After the audio signal is processed through the operational amplifier, it is fed back through resistor R230 to the input inverting terminal of said operational amplifier OA228. Such feedback achieves a significant signal gain. The amplified signal is then transmitted through coupling capacitor C232, which is connected in series to resistor R234, in turn connected to the negative inverting terminal of operational amplifier OA236. This amplifier is biased and grounded through the non-inverting terminal by means of resistors R238 and R240. The output of operational amplifier OA236 is fed back by means of resistor R242 to its own negative inverting input terminal. Such circuit configuration achieves additional significant gain.

The signal at the output of operational amplifier OA236 enters into the threshold sensitivity control circuit 300 by means of coupling capacitor C244 and potentiometer R332. This threshold sensitivity control circuit 300 uses a variable resistor R332 in order to set and select the threshold for the operation of the timer triggering amplifier circuit 400. The output of resistor R332 from sensitivity control circuit 300 is communicated to the input of the negative terminal of comparator CMP440 of timer triggering circuit 400. Resistors R442 and R444 connected to the positive terminal of comparator CMP440 act as a voltage divider setting a threshold reference for the operation of comparator CMP440. The output signal pulse from comparator CMP440 is sent on to the trigger input of the integrated circuit timer 500. In its preferred embodiment, the integrated circuit timer 500 consists of an IC timer chip of a model and design as indicated on Table 1. The IC timer 550 is grounded at terminal T1, triggered at terminal T2 as previously indicated and voltage controlled at terminal T5 by means of capacitor C552. The DC power supply is coupled to the timer through pin T8. Pin T4 is connected to pin T8 in order to avoid the possibility of false triggering of internal reset component. The duration of the output signal of the IC timer 550 may be set by adjustment of resistors R664 and R662, which are connected in series. This resistor network working together with capacitor C660, which is connected to pin T6, act to set the time constant to the IC timer 550. The signal created at the output of the IC timer 550 passes through pin T3 of the timer to resistor R560. When connected as previously indicated, IC timer 550 is configured for a monostable operation producing a one-shot signal of duration for a period of time governed by a proportional relationship to the product of the capacitor C660 and the effective resistance of resistors R662 and R664.

The IC timer 550 is essentially a monostable multivibrator. Electronic switching circuit 700 consists of the resistor R560 coupled to the base of an NPN transistor T770 in a common emitter mode. When the monostable operational control signal reaches the base of NPN transistor T770, the transistor is turned on for a period of time of substantially equal duration to the length of time of the monostable multivibrator digital signal. As the base of the NPN transistor T770 controls current flow through the electrical motor circuit 18, switching "on" said transistor completes a circuit of the electrical motor 18 and turns it on for a period of time of substantially equal duration to the length of time that transistor T770 is turned "on".

Thus, in terms of overall operation, in this particular electronic circuitry embodiment, when an audio frequency signal is sent by the microphone through the amplification circuit 200A and threshold sensitivity control circuit 300 and out the timer triggering circuit 400 to the digital integrated circuit timer 500, the digital circuitry of circuit 500 is triggered to emit a one-shot pulse of duration preset by the time set control 600. That digital signal, substantially independent of the amplitude of the audio signal, turns on an electronic switch which, in turn, allows the electrical motor 18 to operate for a given length of time. The diode D750 acts as a transient clipper in parallel with the inductor coils of motor 18.

An alternative embodiment of this invention is shown in FIG. 4 where processing of the audio frequency signal for use in triggering the integrated circuit timer 500 is accomplished by the use of digital logic gating elements. As shown in FIG. 4, the audio frequency travels along the microphone input to pin N5 of NOR gate 250. Pin N6 input of NOR gate 250 is a grounded input. As the audio frequency signal oscillates, the signals processed from the microphone alternate in strength through input pin N5 of NOR gate 250.

Since pin N6 is removed from the circuit, the input of pin N5 controls the excitation of NOR gate 250. The signal is amplified through feedback through resistor R258 to achieve a gain of amplitude similar to that achieved by the first stage of signal amplification circuit 200A. This signal is sent to coupling capacitor C252 where it is transmitted to the signal input pin N2 of NOR gate 254. Pin N1 of NOR gate 254 is grounded, and thereby removed from the circuit's operation. When the input signal at pin N2 of said NOR gate 254 swings in strength because of the intermittent nature of the signal coming from NOR gate 250, the output signal at pin N3 of NOR gate 254 will be fed back through resistor R256 to achieve an amplitude gain similar to that achieved by the second stage of signal amplification circuit 200A.

In order to prevent the constant firing of the logic gating elements of the processing circuit 200D, the output signals of each gate of the circuit are respectively fed back to the signal input pins by resistors R256 and R258 respectively. An additional purpose of the feedback, other than signal gain, is to attain stability and to inhibit processing of additional signals from noise in this system whose origin is other than new audio stimulus.

Turning to threshold sensitivity control circuit 300D, the processed signal at the output of pin 3 of NOR gate 254 is fed into variable resistor R340, which has a sensitivity adjustment, grounded at one terminal for signal referencing and manually adjustable to set the threshold for the input signal terminal, pin N9 of NOR gate NOR 450. Pin N8 of said NOR 450 gate is a grounded input, allowing NOR 450 to function as an inverter. As the signal is processed through pin N9, the threshold is set by resistor R340 in such a manner so that NOR gate NOR 450 is only triggered when a predetermined desired threshold is met. When input pin N9 of gate NOR 450 receives the audio signal, the output is triggered and a signal is processed out from pin 10 by gate NOR 450. That signal is directly inputted to the trigger terminal T2 of IC 550. From that point in this circuit onward, the operation is substantially the same as the previously described embodiment.

Below is a table of the components which are recommended for use and their ratings and tolerances.

TABLE 1

| Ref. No. | Characteristic | Rating Value/Function |
|---|---|---|
| C220 | Capacitor | .022 microfarads |
| R222 | Resistor | 1 M ohms |
| R224 | Resistor | 1 M ohms |
| R226 | Resistor | 10 k ohms |
| OA228 | Operational amplifier 324 series | Transducer amplifier |
| R230 | Resistor | 1 M ohms |
| C232 | Capacitor | .022 microfarads |
| R234 | Resistor | 10 k ohms |
| OA236 | Operational amplifier 324 series | Transducer amplifier |
| R238 | Resistor | 1 M ohms |
| R240 | Resistor | 1 M ohms |
| R242 | Resistor | 1 M ohms |
| C244 | Capacitor | .022 microfarads |
| NOR 250 | 4001 NOR gate | CMOS-amplifier |

TABLE 1-continued

| Ref. No. | Characteristic | Rating Value/Function |
|---|---|---|
| C252 | Capacitor | .022 microfarads |
| NOR 254 | 4001 NOR gate | CMOS-amplifier |
| R256 | Resistor | 1 M ohms, ¼ w |
| R258 | Resistor | 1 M ohms, ¼ w |
| R332 | Resistor (variable) | 50 k ohms |
| R340 | Resistor (variable) | 50 k ohms |
| CMP440 | Operational amplifier 324 series | Comparator mode |
| R442 | Resistor (reference setting) | 100 k ohms |
| R444 | Resistor (voltage divider) | 56 k ohms |
| NOR 450 | 4001 NOR gate | CMOS-inverter |
| IC 550 | 7555 timer | Monostable mode |
| C552 | Capacitor | .022 microfarads |
| R560 | Resistor | 2.2 k ohms, ¼ w |
| C660 | Capacitor | 47 microfarads, 16 v |
| R662 | Resistor | 100 k ohms, ¼ w |
| R664 | Resistor | 1 M ohms |
| D750 | Diode | 1N 4001-transient clipper |
| T770 | NPN transistor | 2N 3568 |

It will be appreciated that numerous changes and modifications can be made to the embodiment shown herein without departing from the spirit and scope of this invention.

What is claimed and desired to be secured by Letters Patent of the United States is:

1. A device which is adapted for rotary operation and includes:
   power supply;
   electrical motor means connected to said power supply;
   rotary load means opeatively associated with the electrical motor means, said electrical motor means and power supply means coupled to sound activated circuit means and said sound activated circuit means comprising:
   a sound transducer for receiving a sound and converting the same to an audio frequency signal;
   signal processing and conditioning means for processing and conditioning said audio frequency signal from said audio transducer;
   threshold audio sensitivity control means operatively associated with said signal processing and conditioning means for establishing a threshold above which a signal will pass from said processing and conditioning;
   timer triggering circuit means coupled to said signal processing and conditioning means for receiving the processed signal having a value greater than the threshold value and for generating a timer trigger signal;
   timer circuit means coupled to said timer trigger circuit for receiving the trigger signal and for activation in response thereto;
   time set control means associated with said timer circuit for setting the time duration of operation of said timer circuit; and
   electronic switch means associated with said timer circuit for receiving an operational control signal for connection with said motor means to operate in response to said timer circuit signal whereby said motor means and rotary load are caused to operate.

2. A device as in claim 1, wherein said rotary load means comprises a turntable rotatable about a vertical axis carrying thereon fanciful shapes.

3. A device as in claim 1, wherein said means comprises a circular display rotatable about a horizontal axis.

4. A device as in claim 1, wherein said load means comprises a hanging unit adapted for rotation about a vertical axis and having suspended therefrom mobile-like means.

5. A device as in claim 1, wherein said load means comprises an air freshener having fan means associated with said motor for rotation and air freshener means positioned downstream of said fan means so that said fan means causes air to flow over said air freshener means.

6. A device as in claim 1, wherein said signal processing and conditioning means includes a pair of capacitance coupled operational amplifiers which are coupled to said audio transducer and said trigger circuit in a resistor feedback configuration for high gain amplification.

7. A device as in claim 6, wherein said threshold audio sensitivity control and said timer triggering circuit are capacitance coupled to said signal processing and conditioning means and include variable resistance means for sensitivity control and a comparator for triggering means; said sensitivity control being capacitance coupled to the output of said signal processing and conditioning means and said triggering circuit comparator means being coupled directly to said variable resistance and also being coupled directly to said timer circuit, whereby the output of the signal processing and conditioning means causes the said triggering circuit comparator means to issue a trigger circuit timing signal.

8. A device as in claim 1, wherein said signal processing and conditioning means includes a plurality of logic gating means, the input of a first logic gating means being directly coupled to said audio transducer and the output being coupled to the input of a second logic gating means and the output of said second logic gating means being coupled to said threshold control means, whereby the first logic gating means receives said audio signal and amplifies said signal, said signal being communicated to the second logic gating means and the second logic gating means thereafter amplifying said amplified signal.

9. A device as in claim 8, wherein each of said logic gating means is a NOR gate.

10. A device as in claim 8, wherein said threshold control means and said timer triggering circuit means includes: (a) variable resistance means coupled to the output of said second logic gating means; and (b) a third logic gating means having an input coupled directly to said variable resistance and an output coupled to said timer circuit means; whereby the output signal from said second logic gating means causes the third logic gating means in said triggering circuit to generate a timer trigger signal.

* * * * *